Jan. 16, 1951 O. E. COLGAN 2,537,944

SEQUENCE AND PRESELECTOR SIGNAL SEEKING SYSTEM

Filed Oct. 6, 1948

Inventor
OLIVER E. COLGAN

By Philip M. Cooper

Attorney

Patented Jan. 16, 1951 2,537,944

UNITED STATES PATENT OFFICE 2,537,944

SEQUENCE AND PRESELECTOR SIGNAL SEEKING SYSTEM

Oliver E. Colgan, Collingswood, N. J., assignor to Radio Corporation of America, a corporation of Delaware Application October 6, 1948, Serial No. 53,114

6 Claims. (Cl. 250—20)

This invention pertains to a preselector for an automatic signal seeking radio receiver, and more particularly to a novel system for preselecting a desired station for signal reception wherein upon manual operation of the station selector mechanism for selecting the particular station desired to be received, the receiver is blocked from operation until the receiver automatic tuning mechanism has approximately reached the desired preselected position, at which time the receiver is automatically unblocked and precise tuner adjustment is obtained by an automatic signal seeking tuning mechanism.

Ordinarily, in the operation of signal-seeking radio receivers, when it is desired to tune in a station, a tuning motor is started to initiate the tuning process and to cause the receiver to be tuned across or scan a particular frequency spectrum. When a signal of sufficient strength is encountered, a portion of the received signal is applied to a control circuit which acts to remove the energy applied to the tuning motor, thereby causing the tuning operation to cease, and permit the receiver to remain tuned to the particular received signal. For the purpose of this application, an automatic signal seeking radio receiver may be defined as any radio receiver having means for operating a tuning device for scanning a frequency spectrum, which tuning operation will automatically cease when a signal of predetermined characteristics is received, and permit the receiver to remain tuned to the particular signal selected. An example of such a system is presented in the pending application of Oliver E. Colgan, Serial No. 25,210, filed May 5, 1948, assigned to Radio Corporation of America, and is generally referred to as a signal-seeking sequence-tuning system.

The present invention contemplates a signal-seeking sequence and preselector tuning system, and it is an object thereof to provide a novel signal-seeking radio receiver having the features of a sequence, and a preselector tuning system.

Another object is to provide a novel automatic signal-seeking radio receiver coupled with a novel preselector utilizing a system for blocking the radio receiver during a portion of the tuning operation until the tuning mechanism moves to a predetermined position corresponding approximately to the tuning position in which a desired station would be received, at which time the signal-seeking function automatically completes the tuning operation to obtain precise tuning.

A further object of the invention is to provide a novel means for electrically blocking the radio receiver during a portion of the signal-seeking operation and for automatically unblocking the receiver when the tuning mechanism closely approaches the selected signal frequency.

A further object of the invention is to provide means for initiating an automatic signal-seeking operation employing a system for blocking the receiver until the tuning motor has driven the tuning mechanism to a preselected position whereupon the receiver is unblocked to permit the signal-seeking function to take over control of the tuning operation upon reception of a signal of predetermined characteristics.

A further object of the invention is to provide means for grounding the antenna of a receiver during the initial phase of the automatic signal-seeking operation until a preselected position of the tuner is reached, at which time the antenna ground connection is automatically removed and the receiver is thereby unblocked so that the signal-seeking function becomes effective to stop further movement of the tuner upon reception of the first signal of predetermined characteristics.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figures 1, 2, 3, 4:
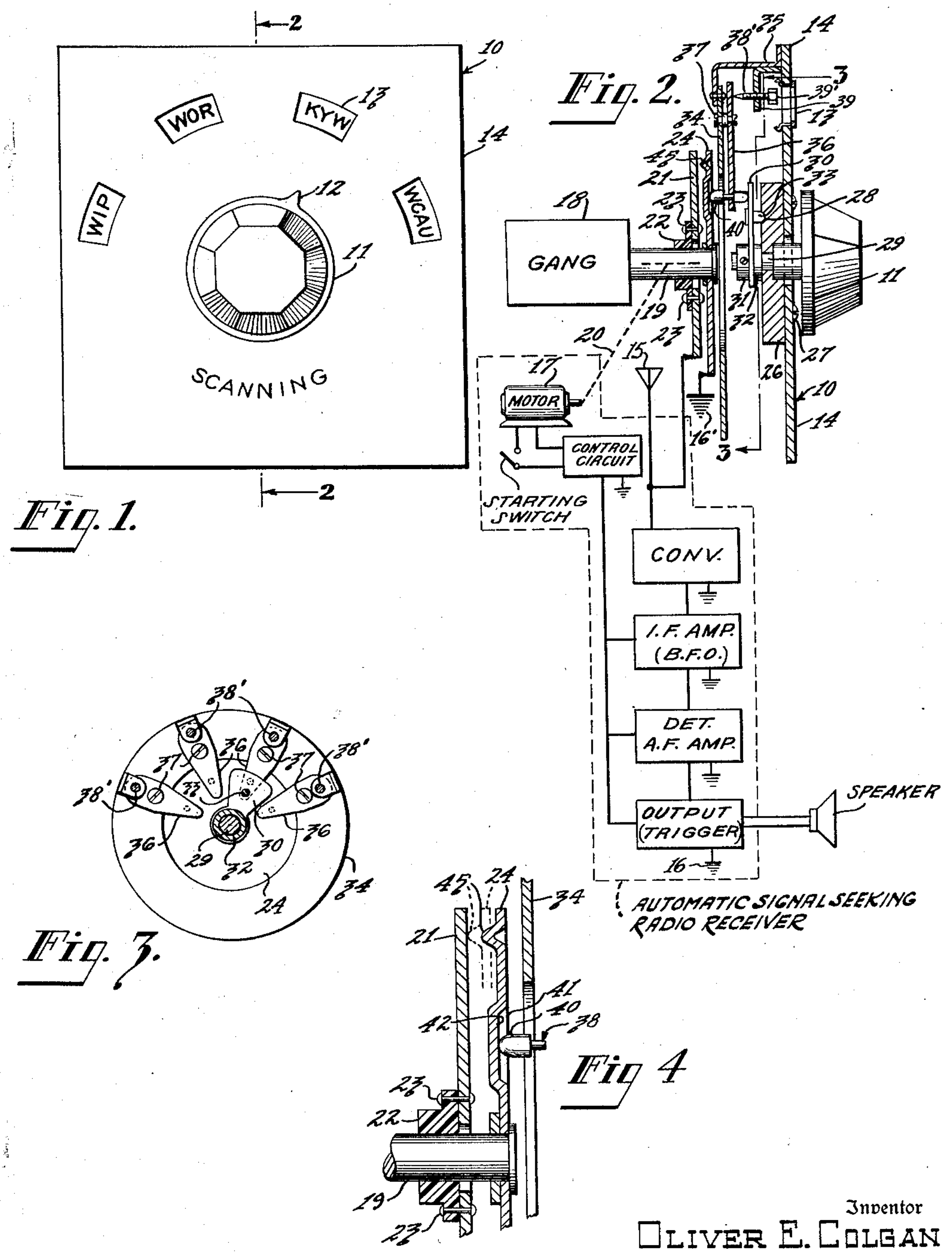
Fig. 1 is a front view of the preselector showing a control knob with a pointer thereon for indicating the particular station selected.
Fig. 2 is a combination block diagram shown in connection with a partial sectional view of the preselector.
Fig. 3 is a view taken substantially along lines 3—3 of Fig. 2 to show the relative position of the detent arm in relation to the adjustable preselector arms, a different preselector arm being used for each station.
Fig. 4 is an enlarged sectional view partially broken away to show detail of the blocking contacts.

Referring to the drawings, there is shown a preselector unit 10 having a knob 11, with a pointer 12 which may be rotated to indicate any one of several stations. The station identification letters such as KYW and WOR are affixed to clips 13, which clips are snapped into openings on the panel 14.

A representative automatic signal seeking radio receiver is shown as a portion of Fig. 2, in block form, and is indicated by legend. The signal seeking receiver represented is taken from the aforementioned Colgan application, Fig. 2, and indicates a receiver section including a converter, an intermediate frequency amplifier, a detector and audio frequency amplifier, and an output tube, the I. F. amplifier acting as a beat frequency oscillator, and the output stage acting as a trigger for operating the control circuit to deenergize the tuning motor 17 when a signal of predetermined characteristics is received. An antenna 15, and ground connections, shown by symbol are connected to the automatic signal seeking radio receiver in a conventional manner. The gang condenser 18 is normally a part of a superheterodyne radio receiver using capacity tuning, and is shown, for clarity, outside of the automatic signal seeking radio section of the drawing and is connected by a shaft 20 with the tuning motor 17. The various portions of the signal seeking section are indicated by comprehensive legend. The preselector portion of the invention may be a unit coupled to the shaft 19 of the tuning condenser 18 of the automatic signal seeking radio receiver.

A tuning motor 17 has a normally closed starting switch, indicated by legend, connected in the control circuit of the tuning motor 17. The control circuit may be connected to the superheterodyne radio receiver in any convenient manner for controlling deenergization of the tuning motor upon receipt of an effective signal from a transmitting station. A gang condenser 18, indicated by the legend "gang," is connected to a shaft 19, which shaft is driven by the tuning motor 17. The driving connection is illustrated by a conventional broken line symbol indicating an operative connection 20 of any convenient type between the tuning motor 17 and the gang condenser shaft 19. The condenser shaft 19 carries a rigid blocking contact 21 which is connected to an insulating hub 22, by means of pins 23. Hub 22 is rigidly secured to the gang condenser shaft 19 for rotation therewith in any convenient manner. A movable blocking contact 24 is also carried by shaft 19 and is positioned adjacent the rigid blocking contact 21 and electrically connected to ground 16'. While the shaft 19 would be normally connected to ground, and would thus provide a connection to ground for contact 24, there is shown, specifically, a separate ground connection on the movable blocking contact 24. Since both the stationary blocking contact 21 and the movable blocking contact 24 are secured to the shaft 19, it will be clear that there is no rotary motion therebetween, but that there may be peripheral motion or bending in a direction normal to the plane of contact 24 to provide engagement between contacts 21 and 24 depending on the position of the gang condenser 18 and its shaft 19 in relation to the setting of the preselector knob 11.

A detent plate 26 is connected to the panel 14 by means of screws 27. The detent plate has a plurality of detents 28 formed therein, one for each knob position. The knob shaft 29 is secured through a central opening in the detent plate 26 and protrudes sufficiently at the rear thereof to permit the detent arm 30 to be secured thereon by means of collars 31 and 32. A detent button 33 is carried by the detent arm 30, so that detent button 33 may engage any one of the detents 28 depending on the position of the detent arm 30 as determined by movement of the preselector knob 11.

A preselector arm support 34, in the form of a ring, is secured by one or more brackets 35 to panel 14. A plurality of preselector arms 36 are pivotally connected to the arm support 34 by adjustment means 37 to permit the various preselector arms to move in a partial arc about the adjustment means 37, the position of each preselector arm being a determining factor in the opening of contact set 21–24 to unblock the receiver by removing the ground on the antenna circuit when the shaft 19 is rotated to the position where the automatic signal seeking function per se actually begins.

Threadedly connected to each bracket 39 is a locking screw 38' having a head 39' on one end, while the other end of the locking screw may engage the upper portion of its respective preselector arm 36 for holding said preselector arm in a desired angular position.

Removal of the clip 13 from the panel 14 will permit a wrench or tool to be inserted through the opening in the panel 14, whereby adjustment of the locking screw 38', and the adjustment means 37 may be obtained from the front of the preselector panel 14, each preselector arm 36 being angularly positioned on preselector arm support 34 by pivotal frictional adjustment means 37.

Each of the preselector arms 36 has a movable double headed button 38 disposed laterally adjacent the inner ends thereof. The double headed button 38 may move laterally in relation to the preselector arm within the confines of the dual button heads so that when engaged by the detent arm 30 pressure may be exerted by the double headed button against the movable contact 24 when the knob 11 is set in registry with one of the preselector arms 36 before the station is tuned in.

The enlarged sectional view presented in Fig. 4, shows the movable blocking contact 24 which, in its preferred form, is a disc of resilient metal having a contact protuberance 45 for engagement with the stationary blocking contact 21 which is also a disc, but of substantially rigid metal. An elongated depression 42 is formed in the movable blocking contact 24 to receive the button portion 40 of the double headed button 38, the button on the opposite end being engageable with the detent arm 30. The elongated depression 42 has its major axis disposed radially from the center of the shaft 19, which axis is in line with the contact protuberance 45. The elongated depression 42 is formed so as to permit the preselector arm 36, which is rotatable on the axis of its adjustment means 37, to swing the double headed button 38 in an arc. Consequently, the preselector arms 36 may be set either to the left or to the right of the positions shown in Fig. 3, depending on the angular position of the elongated depression 42 and the gang condenser 18 for the particular station. The exact position of the preselector arm will depend on the frequency of the desired station and the consequent alignment of the various components in relation to the tuning device position. The angular position of the preselector arm 36 on the adjustment means 37 will determine the exact location of the button portion 40 in the elongated depression 42.

While the contacts 21 and 24 may take various forms, they are both represented herein as being disc-like in shape. It is to be understood that the protuberance 45 of contact 24 is the only part of contact 24 that ever engages contact 21, and since contact set 21 and 24 is secured on shaft 19, contact 21 would effectively function if it were only a rigid finger in lieu of a disc.

The flexibility of the contact 24 is such that, when the pointer 12 is directed to a particular station identification, the contact set 21—24 will be closed until the shaft 19 rotates sufficiently to permit the button 40 to ride into the elongated depression 42 and thereby cause contact set 21—24 to open.

In normal operation, when it is desired to preselect a specific station for signal reception other than the one to which the receiver is then tuned, the tuning knob 11 will have the pointer 12 directed toward the station identification letters on one of the clips such as 13, as presented in Fig. 1. When this is done, the arrangements of parts will be as set forth in Fig. 2, except that the button portion 40 will not be resting in the elongated depression 42, but instead will ride on the flat surface 41 of the contact 24 so that the button portion 40 will distort the flexible contact 24, and the protuberance 45 will engage the rigid contact 21, as shown dotted in Fig. 4. The position of contact 24 shown in solid lines in Fig. 4, occurs when the shaft 19 has thereafter rotated so that the desired station is nearly tuned in. When the protuberance 45 of contact 24 disengages contact 21, the ground connection is removed from the antenna circuit, and final tuning of the preselected station is completed by the signal seeking automatic tuning control mechanism.

When it is desired to have the station tuned in after the preselector knob is set to the proper position, the operator of the set will close the starting switch of the automatic signal seeking radio. The tuning motor will then start to rotate in a given direction, with the consequent rotation of the disc-like contacts 21 and 24 rotating simultaneously with the shaft 19, until the contact member 24 rotates sufficiently to permit the elongated depression 42 to come into alignment with the button portion 40, at which time the button portion 40 rides off the flat surface 41 of the movable contact 24 and drops into the elongated depression 42. Since the movable contact 24 is made of resilient material, the contact protuberance 45 will disengage the stationary contact 21, thereby interrupting the antenna-to-ground connection and unblock the receiver over a small tuning range sector and permitting the signal seeking function to complete the tuning operation.

The position of the preselector arm for the particular station desired to be tuned in, will be set so that the receiver will be unblocked as the scanning of the gang condenser approaches the sector position for reception of the signal of desired frequency for the particular station. The opening of contact set 21—24, as determined by the position of the preselector arm, will take place just before the desired station frequency is properly tuned-in, so that when the automatic signal-seeking circuit per se is permitted to operate, the first effective control signal would be the signal of predetermined characteristics from the desired station. Since the receiver is blocked due to the antenna being connected to ground throughout the entire mechanical scanning operation, all intermediate stations, regardless of signal strength, would naturally have no effect on the receiver.

For sequence operation, the pointer of the preselector knob should be directed to the lower part of the panel indicated by legend as "scanning." When the preselector knob is so positioned, contact 24 is not in engagement with contact 21, and the antenna circuit is not grounded, thereby permitting the normal signal-seeking sequence operation to control the tuning. The first signal received thereafter, of predetermined characteristics, during the tuning operation will automatically stop the tuner motor.

In operation, when preselection of a particular station has been made by properly setting the selector switch to the desired position, such as by selection of station KYW, the contact 24 will be in engagement with contact 21 so that the antenna 15 is connected to the ground 16'. Thereafter, upon actuation of the starting switch, the motor 17 will be energized so that the shaft 19 will rotate the movable element of the tuner along with the contact set 21 and 24. When the shaft 19 has rotated sufficiently so that the button 40 connected on the selector arm 38 drops into the elongated depression 42 on the contact 24, contact set 21—24 will be opened and the ground 16', which before was connected to the antenna 15, will be disconnected. Any signal thereafter impressed upon the antenna 15 will likewise be impressed upon the radio receiver as the tuning motor 17 continues to run. As soon as an effective signal is received, which would normally be the signal from the preselected station KYW, the output trigger circuit, shown in the block diagram, will actuate the control circuit to deenergize the tuning motor 17. With this arrangement, preselection of a particular station may be obtained with the precision tuning of an automatic signal seeker, such as the type set forth in the aforementioned Colgan application, Serial No. 25,210.

While a gang condenser has been specifically illustrated as the tuning element, it is to be understood that the invention may be used with a permeability or other type tuner, it being understood that the necessary linkage between the tuner and the motor will be provided depending upon the type of movement employed.

From the foregoing, it will be seen that the novel sequence and preselector tuning system of the invention will permit automatic tuning to any one of a plurality of preselected stations, or will permit stations to be tuned in automatically in sequence.

What is claimed is:

1. In a tunable radio receiver having an antenna input terminal, switching means for grounding said antenna terminal to block said radio receiver for a portion of the tuning operation, selector means for determining the operation position of said antenna circuit switching means, and an automatic tuning system connected to said receiver and responsive to an incoming signal impressed upon said receiver, said automatic tuning system including means for controlling said switching means to unground said antenna terminal and thereby unblock said receiver.

2. In a radio receiver for signal reception from one of a plurality of stations, including a tuner having a movable element for scanning a continuous range of frequencies, drive means for operating said tuner, switching means for blocking the radio receiver during a major portion of the tuning operation, means for controlling said switching means to cause unblocking of said receiver through a predetermined sector of said tuner movable element, and means for stopping the movement of said tuner movable element in response to a predetermined signal condition in said sector only.

3. A radio receiver for receiving signals from preselected stations, a variable tuning element, means for automatically driving said variable tuning element for tuning over a continuous range of frequencies, a single manually operable switch for initiating operation of said automatic driving means, manually operable preselector means for selecting a small sector of said range of frequencies for said variable tuning element including one of said preselected stations including, means for automatically blocking said receiver until said tuning element is driven to said sector, and means for automatically causing cessation of operation of said variable tuning element upon reception of the first signal of predetermined characteristics in said sector.

4. A radio receiver for receiving signals from preselected stations said receiver having an antenna input terminal, a variable tuning element, means for causing said variable tuning element to scan a continuous range of frequencies, control means for causing scanning cessation at a predetermined signal condition, and preselector means for selecting a sector of said range including a particular station for signal reception, last said means including an engageable rigid contact connected to said antenna input terminal and a movable contact secured to said variable tuning element and grounded, a supporting structure, a plurality of selector arm means carried by said supporting structure, and means for causing one of said selector arm means corresponding to a preselected station to be positioned for causing engagement of said contacts until said sector is reached by said scanning means, whereby said antenna circuit is shorted thereby preventing said signal condition except in said selected sector.

5. In a radio receiver for receiving signals from preselected stations, a variable tuning element, means for causing said variable tuning element to scan a continuous frequency range, control means for causing scanning cessation at a predetermined signal condition, and preselector means for selecting a sector of said range including a particular station for signal reception, last said means including a pair of engageable contact members secured to said variable tuning element for shorting out signal reception until said sector is scanned, a supporting structure, a plurality of selector arms carried by said supporting structure, means carried by each of said selector arms for engagement with one of said contacts, detent means for causing said means carried by one of said selector arms corresponding to a preselected sector to be positioned for causing disengagement of said contacts when said sector is scanned, and detent control means for positioning said detent means.

6. In a radio receiver having an antenna circuit for receiving signals from preselected stations, a variable tuning element, means for causing said variable tuning element to scan a continuous range, control means for causing scanning cessation at a predetermined signal condition, preselector means for selecting a small sector of said continuous range including a particular station for signal reception, last said means including a contact set adjusted to short said antenna circuit until said variable tuning element is positioned to said sector for signal reception from the particular station selected, whereby said control means thereafter causes scanning cessation when the predetermined signal condition is attained.

OLIVER E. COLGAN.

REFERENCES CITED

The following references are of record in the file of this patent:

UNITED STATES PATENTS

| Number | Name | Date |
|---|---|---|
| 2,320,808 | Van Lammern et al. | June 1, 1943 |
| 2,426,580 | O'Brien | Aug. 26, 1947 |
| 2,467,422 | Bruene | Apr. 19, 1949 |

FOREIGN PATENTS

| Number | Country | Date |
|---|---|---|
| 466,281 | Great Britain | May 26, 1937 |